United States Patent
Deligiannis et al.

(10) Patent No.: US 11,480,630 B2
(45) Date of Patent: Oct. 25, 2022

(54) NON-ORTHOGONALITY ADJUSTMENT BASED ON A DUTY CYCLE

(71) Applicant: Allegro MicroSystems, LLC, Manchester, NH (US)

(72) Inventors: Sergio Nicolás Deligiannis, Buenos Aires (AR); Nicolás Rigoni, Buenos Aires (AR)

(73) Assignee: Allegro MicroSystems, LLC, Manchester, NH (US)

(*) Notice: Subject to any disclaimer, the term of this patent is extended or adjusted under 35 U.S.C. 154(b) by 61 days.

(21) Appl. No.: 17/112,107

(22) Filed: Dec. 4, 2020

(65) Prior Publication Data

US 2022/0179013 A1 Jun. 9, 2022

(51) Int. Cl.
| | |
|---|---|
| G01R 33/00 | (2006.01) |
| H03K 3/017 | (2006.01) |
| G01R 35/00 | (2006.01) |
| G01R 33/06 | (2006.01) |

(52) U.S. Cl.
CPC ..... *G01R 33/0017* (2013.01); *G01R 33/0029* (2013.01); *G01R 33/06* (2013.01); *G01R 35/00* (2013.01); *H03K 3/017* (2013.01)

(58) Field of Classification Search
CPC ............ G01R 33/0017; G01R 33/0029; G01R 33/06; G01R 35/00; H03K 3/017
See application file for complete search history.

(56) References Cited

U.S. PATENT DOCUMENTS

| | | | |
|---|---|---|---|
| 4,246,497 A | * | 1/1981 | Lawson ............... G01R 25/005 327/12 |
| 9,664,752 B2 | | 5/2017 | Monreal et al. |
| 9,733,106 B2 | | 8/2017 | Judkins, III et al. |
| 9,897,464 B2 | | 2/2018 | Judkins, III et al. |
| 10,288,698 B2 | | 5/2019 | Romero |
| 10,578,679 B2 | | 3/2020 | Sitorus et al. |
| 10,598,739 B2 | | 3/2020 | Shoemaker et al. |
| 10,866,118 B2 | | 12/2020 | Foletto et al. |
| 10,908,229 B2 | | 2/2021 | Richards |
| 2006/0291589 A1 | * | 12/2006 | Eliezer .................. H04L 27/365 375/302 |
| 2008/0013445 A1 | * | 1/2008 | Siwiak ............... H04B 1/71635 370/206 |
| 2010/0297974 A1 | * | 11/2010 | Yamamoto ............... H04B 1/28 455/285 |

(Continued)

OTHER PUBLICATIONS

U.S. Appl. No. 16/887,898, filed May 29, 2020, Rigoni, et al.
(Continued)

*Primary Examiner* — Akm Zakaria
(74) *Attorney, Agent, or Firm* — Daly, Crowley, Mofford & Durkee, LLP (57) ABSTRACT

According to some embodiments, a method implemented in electronic circuitry includes: receiving a first signal having a sinusoidal waveform; receiving a second signal having a sinusoidal waveform; generating a composite signal responsive to the first and second signals; determining an orthogonality adjustment coefficient based on a duty cycle of the composite signal; and applying the orthogonality adjustment coefficient to generate an adjusted second signal that is substantially orthogonal to the first signal.

21 Claims, 7 Drawing Sheets

(56) References Cited

U.S. PATENT DOCUMENTS

| | | | | |
|---|---|---|---|---|
| 2012/0019299 A1* | 1/2012 | McLeod | ............ | H03K 5/1565 |
| | | | | 327/175 |
| 2014/0369225 A1* | 12/2014 | Burchard | ............... | G01S 17/46 |
| | | | | 375/267 |
| 2016/0146607 A1* | 5/2016 | Celikel | ............... | G01C 19/725 |
| | | | | 356/465 |

OTHER PUBLICATIONS

U.S. Appl. No. 16/689,494, filed Nov. 20, 2019, Foletto.
U.S. Appl. No. 16/593,308, filed Oct. 4, 2019, Rigoni, et al.
U.S. Appl. No. 16/214,768, filed Dec. 10, 2018, Rigoni, et al.

* cited by examiner

NON-ORTHOGONALITY ADJUSTMENT BASED ON A DUTY CYCLE

BACKGROUND

Some sensors include two or more magnetic field sensing elements. For example, a magnetic field angle sensor can have multiple Hall elements to detect an angular position of a rotating magnet. In order to accurately detect a magnetic field, the magnetic field sensing elements may need to be aligned, not only with respect to the magnetic field that they sense, but also with respect to each other. If magnetic field sensing elements are individual components, they may be placed (e.g. on a printed circuit board) so that they are aligned. As another example, if the magnetic field sensing elements are part of a semiconductor die, they may be formed on or as part of the semiconductor die so that they are aligned. Misalignment of magnetic field sensing elements can introduce errors in the output signals of the magnetic field sensor, reducing sensitivity and/or accuracy of the sensor.

In some applications, a signal of interest may be composed of two signals that should be orthogonal to achieve desired performance characteristics. For example, a magnetic field angle sensor may require that two signals generated by different Hall elements are orthogonal to each other. Non-orthogonality of the signals may result, for example, from misalignment of the Hall elements among other causes.

The accuracy of magnetic field sensors can also be adversely affected if a magnetic field signal experiences an offset. Offset is characterized by an output signal of a magnetic field sensing element not representing a zero magnetic field when the sensing element experiences the same. An offset can occur as a result of mechanical stresses, magnetic interference from nearby components or pollutants, and/or temperature variations. Offset of the magnetic field signal can degrade the accuracy of the magnetic target detection since the magnetic field signal is not centered within the dynamic range of the detector.

SUMMARY

Described herein are structures and techniques to compensate for non-orthogonality between two signals based on a duty cycle. Also described herein are structures and techniques to adjust a non-zero signal offset based on a duty cycle. Disclosed embodiments can be implemented within, for example, a magnetic field angle sensor or other type of sensor. Disclosed embodiments can be realized within an integrated circuit (IC) at low cost and within a relatively small die area.

According to one aspect of the present disclosure, a method implemented in electronic circuitry includes: receiving a first signal having a sinusoidal waveform; receiving a second signal having a sinusoidal waveform; generating a composite signal responsive to the first and second signals; determining an orthogonality adjustment coefficient based on a duty cycle of the composite signal; and applying the orthogonality adjustment coefficient to generate an adjusted second signal that is orthogonal to the first signal.

In some embodiments, the method can include: calculating the duty cycle of the composite signal; and determining the orthogonality adjustment coefficient by comparing the duty cycle to a threshold value. In some embodiments, the threshold value may be 50%. In some embodiments, generating the composite signal responsive to the first and second signals can include: generating a first sign signal indicating a sign of the first signal; generating a second sign signal indicating a sign of the second signal; and generating the composite signal as an exclusive or (XOR) of the first sign signal and the second sign signal.

In some embodiments, determining the orthogonality adjustment coefficient may include: calculating the duty cycle of the composite signal for a current signal period; comparing the calculated duty cycle to a threshold value to generate a duty cycle comparison value; and accumulating the duty cycle comparison value over time to generate the orthogonality adjustment coefficient. In some embodiments, applying the orthogonality adjustment coefficient to generate the adjusted second signal can include: scaling the first signal by the orthogonality adjustment coefficient; and subtracting the scaled first signal from the second signal to generate the adjusted second signal.

In some embodiments, the first signal and the second signal may be responsive to a magnetic field. In some embodiments, the first signal and the second signal can have zero offset. In some embodiments, the first signal and the second signal may have the same frequency. In some embodiments, the method can include: storing the orthogonality adjustment coefficient to a memory, wherein applying the orthogonality adjustment coefficient to generate the adjusted second signal includes accessing the orthogonality adjustment coefficient from the memory.

According to another aspect of the present disclosure, a system includes an orthogonality adjustment processor that comprises a first input to receive a first signal having a sinusoidal waveform, a second input to receive a second signal having a sinusoidal waveform, a coefficient estimation circuit, a compensation circuit, a first output to provide the first signal, and a second output to provide an adjusted second signal. The coefficient estimation circuit is configured to generate a composite signal responsive to the first and second signals and determine an orthogonality adjustment coefficient based on a duty cycle of the composite signal. The compensation circuit is configured to apply the orthogonality adjustment coefficient to generate the adjusted second signal.

In some embodiments, the coefficient estimation circuit may be configured to calculate the duty cycle of the composite signal and determine the orthogonality adjustment coefficient by comparing the duty cycle to a threshold value. In some embodiments, the threshold value is 50%. In some embodiments, the coefficient estimation circuit may be configured to: generate a first sign signal indicating a sign of the first signal; generate a second sign signal indicating a sign of the second signal; and generating the composite signal as an exclusive or (XOR) of the first sign signal and the second sign signal.

In some embodiments, the coefficient estimation circuit may be configured to: calculate the duty cycle of the composite signal for a current signal period; compare the calculated duty cycle to a threshold value to generate a duty cycle comparison value; and accumulate the duty cycle comparison value over time to generate the orthogonality adjustment coefficient. In some embodiments, the compensation circuit can be configured to scale the first signal by the orthogonality adjustment coefficient and subtract the scaled first signal from the second signal to generate the adjusted second signal.

In some embodiments, the system can include a first magnetic field sensing element and a second magnetic field sensing element, wherein the first signal and the second signal are responsive to a magnetic field sensed by the first and second magnetic field sensing elements respectively. In some embodiments, the first signal and the second signal can have zero offset. In some embodiments, the first signal and the second signal may have the same frequency. In some embodiments, the system can further include a memory configured to store the orthogonality adjustment coefficient, wherein the compensation circuit is configured to access the orthogonality adjustment coefficient from the memory.

According to another aspect of the present disclosure, a method implemented in electronic circuitry comprises: receiving a time-varying input signal; generating a sign signal indicating a sign of the input signal; calculating a duty cycle of the sign signal; estimating a signal offset value by comparing the calculated duty cycle to a threshold value; and subtracting the signal offset value from the input signal to generate an output signal having zero offset.

BRIEF DESCRIPTION OF THE DRAWINGS

The manner of making and using the disclosed subject matter may be appreciated by reference to the detailed description in connection with the drawings, in which like reference numerals identify like elements.

The drawings are not necessarily to scale, or inclusive of all elements of a system, emphasis instead generally being placed upon illustrating the concepts, structures, and techniques sought to be protected herein.

DETAILED DESCRIPTION

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the terms "target" and "magnetic target" are used to describe an object to be sensed or detected by a magnetic field sensor or magnetic field sensing element.

Figure 1:
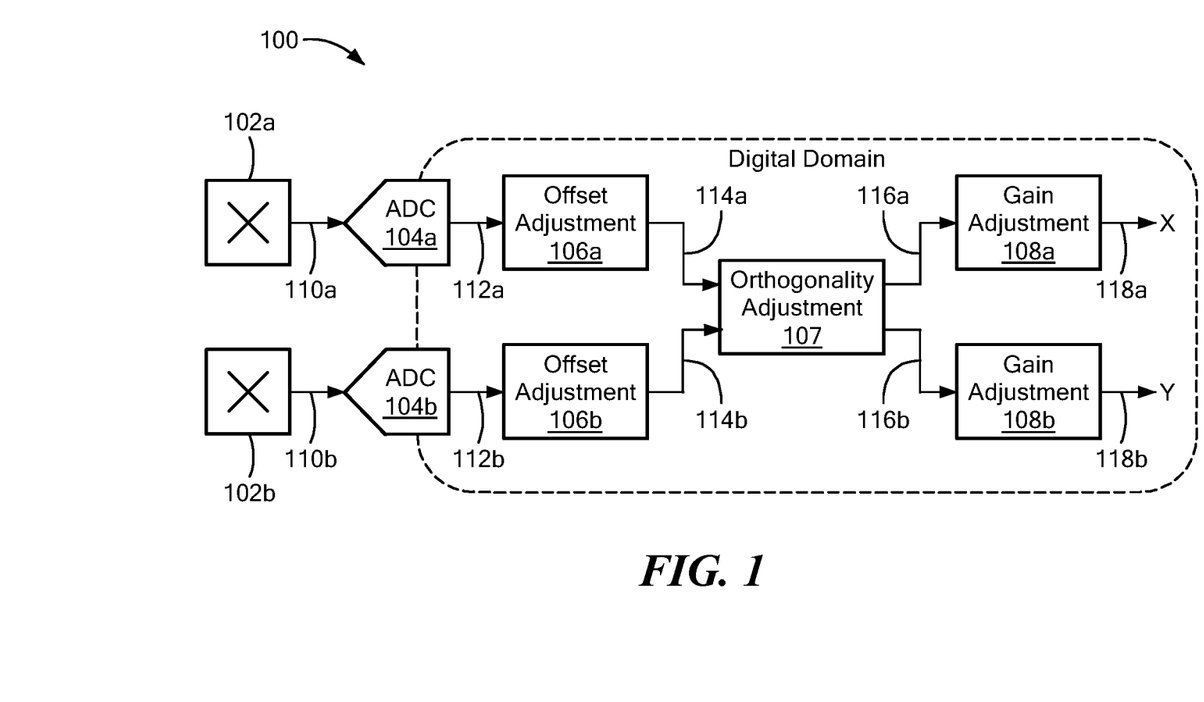
FIG. 1 is a block diagram of a magnetic field sensor having offset and orthogonality adjustment processors, according to some embodiments of the present disclosure.

FIG. 1 shows a magnetic field sensor 100, according to some embodiments. The illustrative magnetic field sensor 100 includes a first magnetic field sensing element 102a, a first analog-to-digital converter (ADC) 104a, a first offset adjustment processor 106a, a second magnetic field sensing element 102b, a second ADC 104b, and a second offset adjustment processor 106b. The magnetic field sensor 100 further includes an orthogonality adjustment processor 107, a first gain adjustment processor 108a, and a second gain adjustment processor 108b. In some embodiments, magnetic field sensor 100 can be configured to detect an angle of rotation of a rotating magnetic field (e.g., a magnetic field generated by a rotating target).

Responsive to a magnetic field, magnetic field sensing elements 102a and 102b can generate magnetic field signals 110a and 110b, respectively. Magnetic field signals 110a, 110b may represent the strength of the magnetic field as sensed by magnetic field sensing elements 102a, 102b. If both magnetic field sensing elements 102a, 102b detect the same magnetic field, then signals 110a, 110b may be quadrature signals, i.e. ninety degrees out of phase with each other. This can be due, for example, to the axes of maximum sensitivity of magnetic field sensing elements 102a, 102b being orthogonal to each other. In one example, magnetic field sensing elements 102a, 102b may be planar Hall elements arranged to have orthogonal axes of maximum sensitivity. As previously discussed, misalignment of magnetic field sensing elements 102a, 102b can cause magnetic field signals 110a, 110b to be non-orthogonal, i.e., having a phase difference greater than or less than ninety degrees.

First and second ADCs 104a, 104b are configured to convert magnetic signals 110a and 110b to digital signals 112a and 112b, respectively, such that digital signals 112a, 112b are also responsive to the magnetic field detections.

First and second offset adjustment processors 106a, 106b are configured to adjust offsets of digital signals 112a, 112b to generate respective first and second offset-adjusted signals 114a, 114b (e.g., such that signals 114a, 114b have substantially zero offset). Offset adjustment processors 106a, 106b can include one or more digital and/or analog circuit elements arranged to adjust the signal offsets. Offset adjustment processors 106a, 106b can correct for offset due to, for example, mechanical stresses, magnetic interference from nearby components or pollutants, temperature variations, etc. In some embodiments, offset adjustment processors 106a, 106b can adjust the signal offsets based on duty cycle calculation as described below in the context of FIGS. 7 and 8. In other embodiments, previously known structures and techniques may be used for offset adjustment.

Orthogonality adjustment processor 107 can include one or more digital and/or analog circuit elements arranged to compensate for non-orthogonality between offset-adjusted signals 114a, 114b. In some embodiments, orthogonality adjustment processor 107 can calculate or otherwise determine an orthogonality adjustment coefficient based on a duty cycle of offset-adjusted signals 114a, 114b (more particularly, based on a duty cycle of a composite signal generated from signals 114a, 114b). The orthogonality adjustment coefficient can be applied to one of the offset-adjusted signals 114a, 114b to generate orthogonality-adjusted signals 116a, 116b that are substantially in quadrature. Techniques and structures that can be implemented within orthogonality adjustment processor 107 are described below in the context of FIGS. 2-6. In some embodiments, offset-adjusted signals 114a, 114b may have substantially identical frequencies (e.g., both signals may be responsive to the same magnetic field).

First and second gain adjustment processors 108a, 108b are configured to adjust gains of orthogonality-adjusted signals 116a, 116b to generate respective first and second output signals 118a, 118b. Gain adjustment processors 108a, 108b can include digital or analog circuitry arranged to adjust the gain of signals 116a, 116b using structures and techniques known in the art. Output signals 118a, 118b can be provided to additional circuitry (not shown) to calculate, for example, an angle of rotation of a rotating target.

Processors 106a, 106b, 107, 108a, and/or 108b can be implemented using digital or analog circuitry, or a combination thereof. In the case of digital processing, sensor 100 may include a digital clock (not shown) to generate a clock signal having a certain frequency that can be expressed, for example, in cycles per second. The clock signal can be coupled to the various digital circuit elements to drive the operation thereof. In other embodiments, sensor 100 may receive a clock signal from an external clock. The clock frequency may be selected, for example, based on a known or expected frequency range of magnetic field signals 110a, 110b.

While embodiments of the present disclosure are described in the context of magnetic field sensors, the structures and techniques sought to be protected herein are not limited to use in magnetic field sensors. For example, disclosed orthogonality adjustment structures and techniques can be applied in various types of systems and devices where in which orthogonal signals are required. Likewise, disclosed offset adjustment structures and techniques can be used in various systems and devices where a zero-offset signal is required.

Figure 2A:
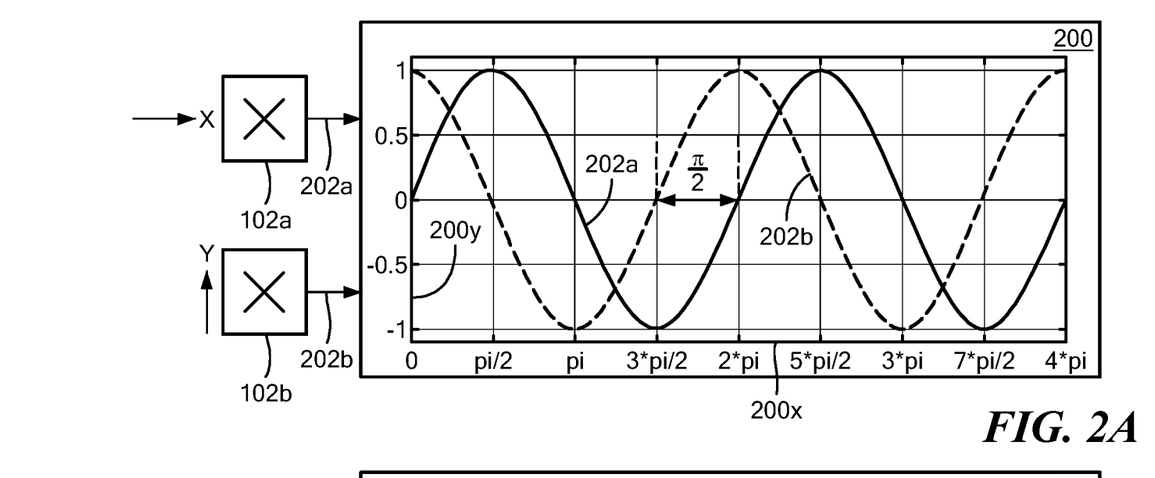
FIG. 2A is a diagram illustrating two orthogonal signals.

FIG. 2A shows an example of two signals that are orthogonal to each other. In the illustrated example, a first signal 202a may be generated by first magnetic field sensing element 102a (e.g., in response to a magnetic field generated by a rotating target) and a second signal 202b may be generated by second magnetic field sensing element 102b (e.g., in response to the same magnetic field). As shown, both signals 202a, 202b may have a zero offset.

Referring to plot 200, horizontal axis 202x may represent an angle, θ, of the magnetic field relative to magnetic field sensing elements 102a, 102b, and vertical axis 202y may represent a corresponding magnitude of the magnetic field. The magnitude of a first signal 202a may be expressed as X=sin θ and the magnitude of a second orthogonal signal 202b may be expressed as $Y^\perp$=cos θ. The angle of the magnetic field relative to magnetic field sensing elements 102a, 102b can be determined using:

$$\theta = \text{atan}\left(\frac{X}{Y^\perp}\right) \quad (1)$$

Figure 2B:
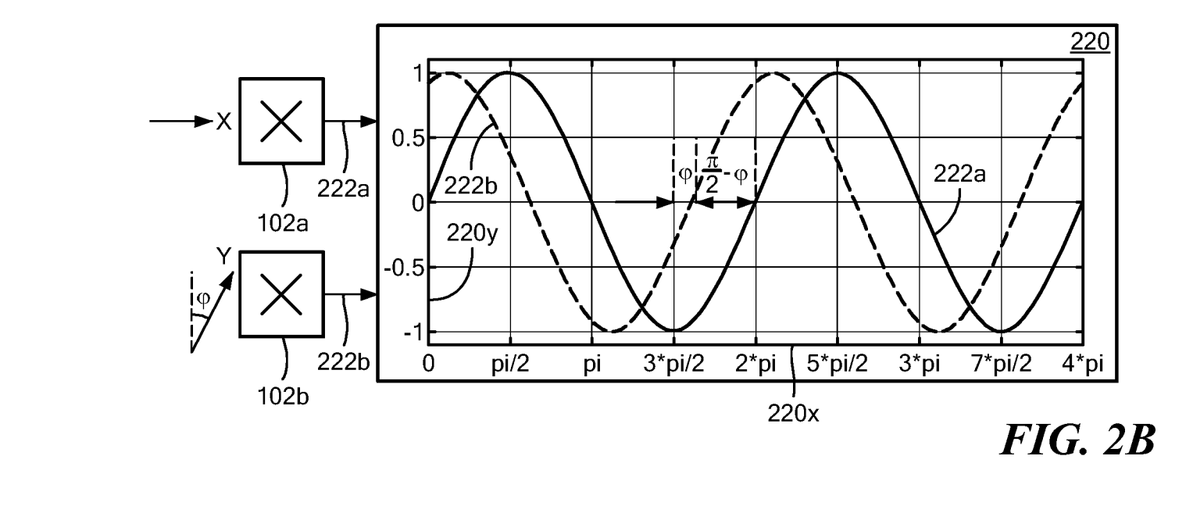
FIG. 2B is a diagram illustrating non-orthogonality between two signals that can be compensated for using disclosed embodiments.

FIG. 2B shows an example of two non-orthogonal signals 222a, 222b. An illustrative plot 220 includes a horizontal axis 222x and a vertical axis 222y which may represent the same quantities as axes 202x and 202y of FIG. 2A. The signals 222a, 222b may have zero offset, as shown. In the case of non-orthogonal signals, the magnitude of a first signal 222a may be expressed as X=sin θ and the magnitude of a second signal 222b may be expressed as Y=cos(θ+φ), where φ is the non-orthogonality angle. Given X and Y, a desired orthogonal signal, $Y^\perp$, can be obtained as follows.

Given the following trigonometric identity:

$$Y = \cos(\theta+\varphi) = \cos(\theta)\cdot\cos(\varphi) + \sin(\theta)\cdot\sin(\varphi) = \cos(\varphi)\cdot[\cos(\theta)+\sin(\theta)\cdot\tan(\varphi)], \quad (2)$$

the desired orthogonal signal, $Y^\perp$, can obtained as a function of the two signals X, Y and the angle φ:

$$Y = \cos(\varphi)\cdot[Y^\perp + \tan\varphi] \quad (3)$$

$$Y^\perp = \frac{Y}{\cos\varphi} - X\cdot\tan\varphi = \frac{1}{\cos\varphi}\cdot[Y - X\cdot\sin\varphi]. \quad (4)$$

Equation (4) can be rewritten as:

$$Y^\perp = A^\perp \cdot [Y - X \cdot B^\perp], \quad (5)$$

where the coefficients $A^\perp$ and $B^\perp$ are defined as:

$$A^\perp = \frac{1}{\cos\varphi} \quad (6)$$

$$B^\perp = \sin\varphi \quad (7)$$

Thus, by determining coefficients $A^\perp$ and $B^\perp$, non-orthogonality between signals X, Y can be compensated for. This, in turn, allows the magnetic field angle, θ, to be accurately calculated using equation (1), according to some embodiments. It is noted that if φ is close to zero then $A^\perp$ is close to one. If φ is not close to zero, then $A^\perp$ affects the sensitivity of the Y channel output signal which can be compensated by adjusting the signal gain (e.g., using gain adjustment processor 108b of FIG. 1). Thus, determining only the coefficient $B^\perp$ can be sufficient to compensate for non-orthogonality, as in the following equation in which $A^\perp$ is assumed to be one (1):

$$Y^\perp = Y - X \cdot B^\perp. \quad (8)$$

Figure 3:
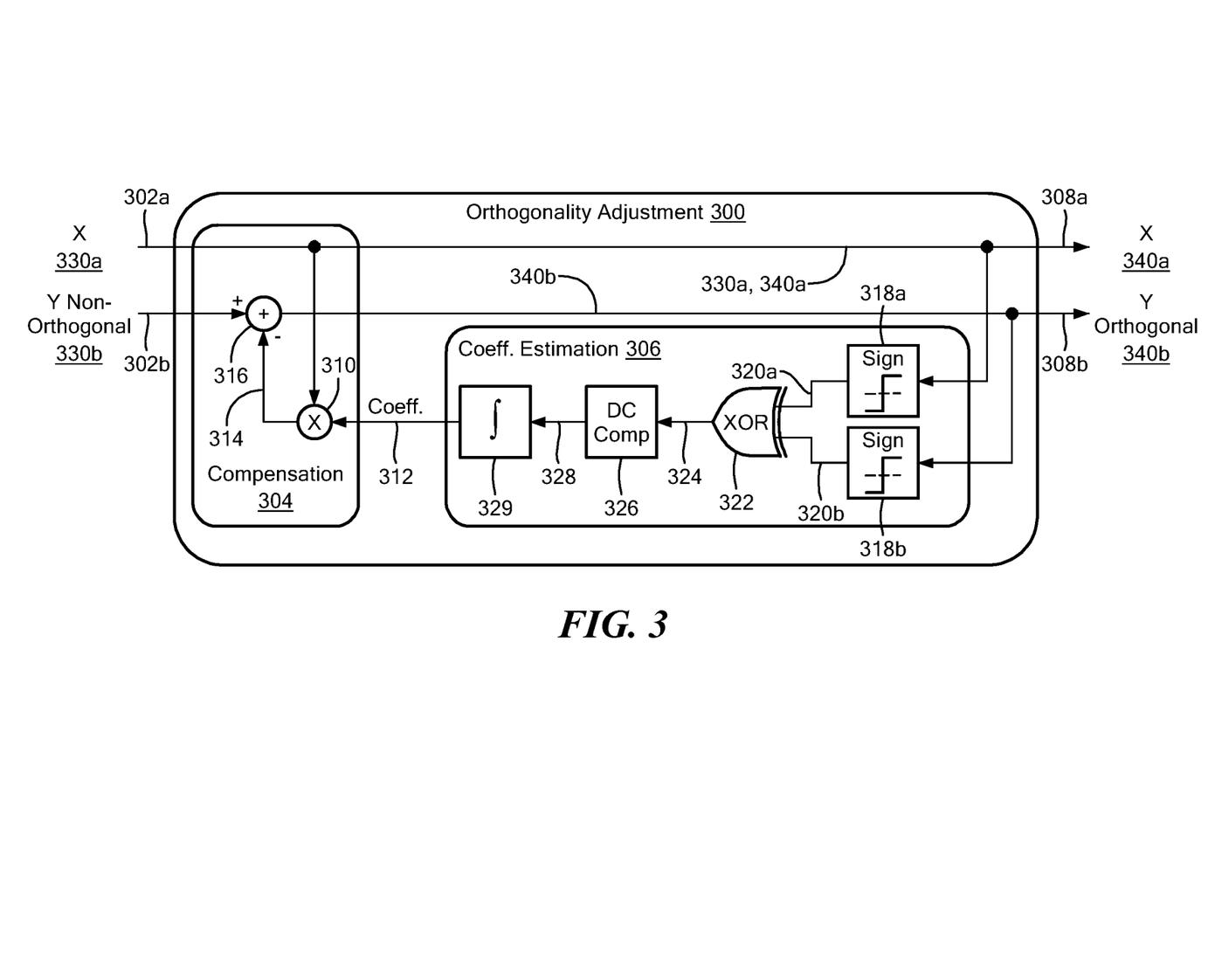
FIG. 3 is a block diagram of an orthogonality adjustment processor, according to some embodiments.

FIG. 3 shows an orthogonality adjustment processor 300 according to some embodiments of the present disclosure. The illustrative orthogonality adjustment processor 300 includes a first input 302a to receive a first input signal 330a and a second input 302b to receive a second input signal 330b. Input signals 330a, 330b may be sinusoidal (i.e., have sinusoidal waveforms) and have substantially the same frequency, and the frequency may be constant over some period of time as discussed below. In general, input signals 330a, 330b may be non-orthogonal (i.e., $\varphi \neq 0$).

Orthogonality adjustment processor 300 includes a compensation circuit 304 to receive input signals 330a, 330b and to generate respective output signals 340a, 340b that are substantially orthogonal to each other (i.e., $\varphi \cong 0$). Output signals 340a, 340b may be provided at respective outputs 308a, 308b. In the embodiment of FIG. 3, compensation circuit 304 includes a multiplication block 310 configured to multiply the first input signal 330a by an orthogonality adjustment coefficient 312 to generate a scaled first input signal 314, as shown. Compensation circuit 304 also includes a summation block 316 to subtract the scaled first input signal 314 from the second input signal 330b to generate the second output signal 340b. Thus, compensation circuit 304 is configured to generate $Y^\perp$ according to equation (8), wherein X corresponds to first input signal 330a, Y corresponds to second input signal 330b, and $B^\perp$ corresponds to orthogonality adjustment coefficient 312. In the example of FIG. 3, the first input signal 330a and the first output signal 340a are the same signal (i.e., only the second input signal 330b is adjusted by processor 300).

As shown in FIG. 3, orthogonality adjustment processor 300 can further include a coefficient estimation circuit 306 configured to estimate or calculate the orthogonality adjustment coefficient 312 used by compensation circuit 304. The coefficient estimation circuit 306 operates by generating a composite signal based on output signals 340a, 340b, calculating a duty cycle of the composite signal, comparing the duty cycle to a threshold, and accumulating a numerical result the duty cycle comparison. In more detail, coefficient estimation circuit 306 includes a first sign block 318a coupled to receive the first output signal 340a and a second sign block 318b coupled to receive the second output signal 340b. Sign blocks 318a, 318b are configured to generate respective first and second sign signals 320a, 320b indicating a sign of signals 340a, 340b, respectively. Sign blocks 318a, 318b can implement the following sign function:

$$\text{Sign}(S_{out}) = \begin{cases} 1; & S_{out} \geq 0 \\ 0; & S_{out} < 0 \end{cases}, \quad (9)$$

where $S_{out}$ corresponds to signal 340a or signal 340b. In some embodiments, sign block 318a and/or 318b can be implemented by reading the most-significant bit (MSB) of the respective output signals 340a, 340b. Other digital or analog implementations may be used to generate sign signals 320a, 320b.

Coefficient estimation circuit 306 further includes an XOR gate 322 to generate a composite signal 324 corresponding to the exclusive or (XOR) of sign signals 320a, 320b. XOR gate 322 can include digital or analog circuitry to implement the following logic table:

TABLE 1

| A | B | A XOR B |
|---|---|---------|
| 0 | 0 | 0 |
| 0 | 1 | 1 |
| 1 | 0 | 1 |
| 1 | 1 | 0 |

If output signals 340a, 340b are orthogonal, the corresponding sign signals 320a, 320b will be in quadrature and the composite signal 324 will have a duty cycle equal to 50%. That is, over a given signal period of duration T, composite signal 324 will have a value one (1) for T/2 units of time and a value of zero (0) for T/2 units of time when the signals are orthogonal. Therefore, to compensate for non-orthogonality, the coefficient 312 should converge to a value such that the composite signal 324 has 50% duty cycle. To achieve this, coefficient estimation circuit 306 can include a duty cycle (DC) comparison block 326 configured to generate a duty cycle comparison value 328 according to the following function:

$$\text{DC\_Comp}(S_{comp}) = \begin{cases} C; & \text{Duty Cycle of } S_{comp} < 50\% \\ -C; & \text{Duty Cycle of } S_{comp} \geq 50\% \end{cases}, \quad (10)$$

where $S_{comp}$ corresponds to composite signal 324 and C corresponds to a constant number (e.g., C=1). In some embodiments, C may be a parameter stored, for example, in EEPROM. As can be seen in FIGS. 4A, 4B, 5A, 5B, discussed below, the period of composite signal 324 (a square wave) is half the period of sinusoidal signals 340a, 340b. As used herein, period T refers to the period of composite signal 324.

In some embodiments, duty cycle comparison block 326 can be implemented with a first register for counting the total number of clock cycles that have occurred within a current period of duration T, and a second register for counting the number of clock cycles during which the composite signal 324 has a value equal to one (1) within the current period. When the value of the first register indicates that the current period has elapsed, duty cycle comparison block 326 can compare the value of the second register to half the value of the first register to generate the duty cycle comparison value 328. In some embodiments, the least-significant bit (LSB) of the first register can be disregarded, which is equivalent to dividing the register value in half. Other digital or analog implementations may be used to calculate duty cycle comparison value 328.

Coefficient estimation circuit 306 further includes an integration block 329 to accumulate the duty cycle comparison value 328 over time to generate the orthogonality adjustment coefficient 312. In more detail, integration block 328 accumulates the duty cycle comparison value 328 on a constant or continuous basis. After each period T a new DC comparison value 328 is added to the integration. When steady state is achieved (i.e., the integration value successfully compensates the non-orthogonality), the duty cycle comparison value 328 should be either zero (i.e., the count for composite signal 324 is exactly half of period's count) or will toggle period after period due to noise or lack of resolution, resulting in a small limit cycling of the orthogonality adjustment coefficient 312. In some embodiments, duty cycle comparison block 326 can count over multiple periods N>1 to reduce/eliminate such small limit cycling. Of note, the generated coefficient 312 can be a positive or negative number owing to how the duty cycle comparison function is defined in equation (10). This allows the illustrated feedback loop to converge on a duty cycle of 50% regardless of the initial duty cycle. Integration block 329 can be implemented using various known digital or analog implementations.

As shown in FIG. 3, coefficient estimation circuit 306 and compensation circuit 304 can be arranged in a closed loop. In this arrangement, orthogonality adjustment processor 300 may continually estimate the orthogonality adjustment coefficient 312 based on the input signals 330a, 330b. This approach may be suitable where input signals 330a, 330b have substantially constant frequency during operation of the device/system in which orthogonality adjustment processor 300 is employed. In other embodiments (e.g., where input signals 330a, 330b have variable frequency), coefficient estimation circuit 306 can be used to estimate the coefficient 312 in a non-continuous manner and the estimated coefficient 312 can be stored in memory (not shown) where it can be accessed and used by compensation circuit 304. For example, orthogonality adjustment coefficient 312 may be calculated during a factory test where input signals 330a, 330b can be held to a constant frequency, and then the coefficient 312 can be stored into an EEPROM or other memory device accessible by orthogonality adjustment processor 300. As another example, coefficient estimation circuit 306 may estimate the coefficient 312 periodically (e.g., during times when the input signals are known to have constant frequency) and hold the coefficient value in a register accessible by orthogonality adjustment processor 300. In general, coefficient estimation circuit 306 can be employed to estimate the coefficient 312 during one or more periods where the input signals 330a, 330b have a substantially constant frequency.

In some embodiments, orthogonality adjustment processor 300 may operate on the assumption that the input signals 330a, 330b are offset adjusted. That is, inputs 302a, 302b of orthogonality adjustment processor 300 may be coupled to the outputs of one or more offset-adjustment processors, such as offset-adjustment processors 106a, 106b of FIG. 1.

Figure 4A:
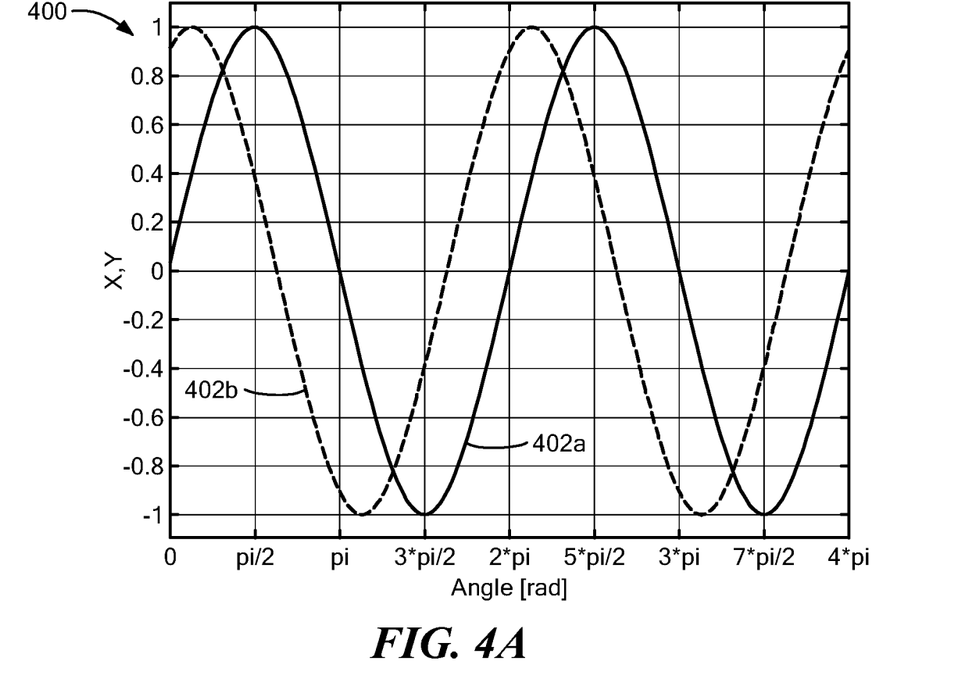
FIGS. 4A and 4B are plots illustrating non-orthogonality between two signals that can be adjusted for using disclosed embodiments.
Figure 4B:
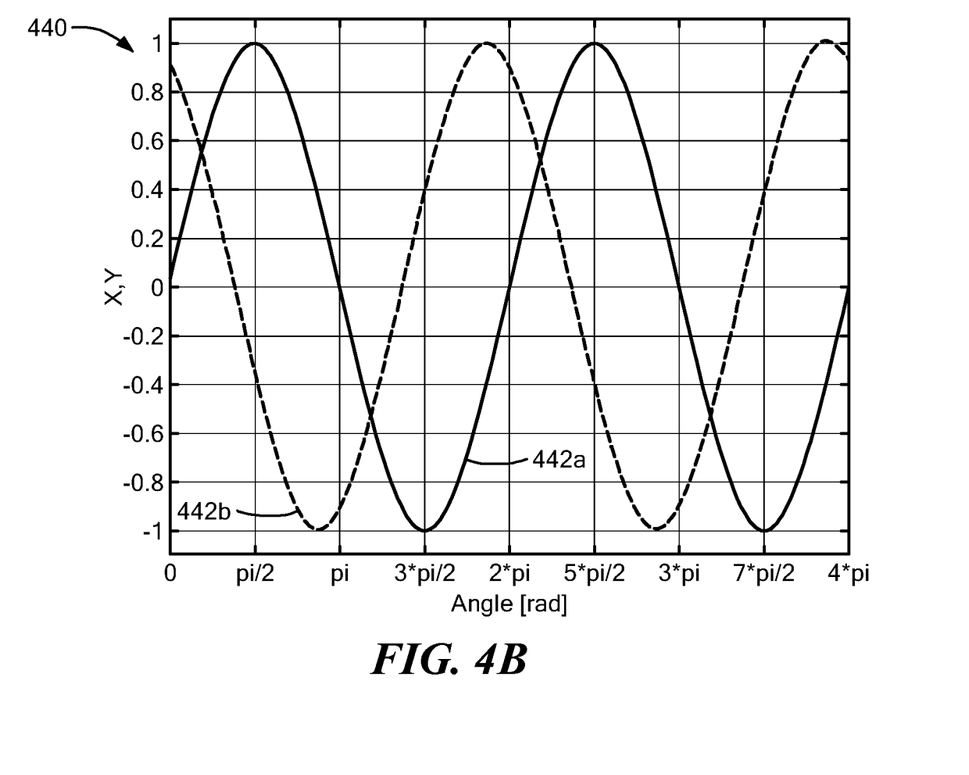

FIGS. 4A and 4B are plots illustrating non-orthogonality between two signals that can be adjusted for using embodiments of the present disclosure (e.g., using orthogonality adjustment processor 300 of FIG. 3). The two signals can be expressed as $X=\sin\theta$ and $Y=\cos(\theta+\varphi)$, where the non-orthogonality is given by the angle $\varphi$. The illustrative plot 400 of FIG. 4A shows non-orthogonal signals 402a, 402b where the angle $\varphi$ is negative ($\varphi<0$). The illustrative plot 440 of FIG. 4B shows non-orthogonal signals 442a, 442b where the angle $\varphi$ is positive ($\varphi>0$).

Figure 5A:
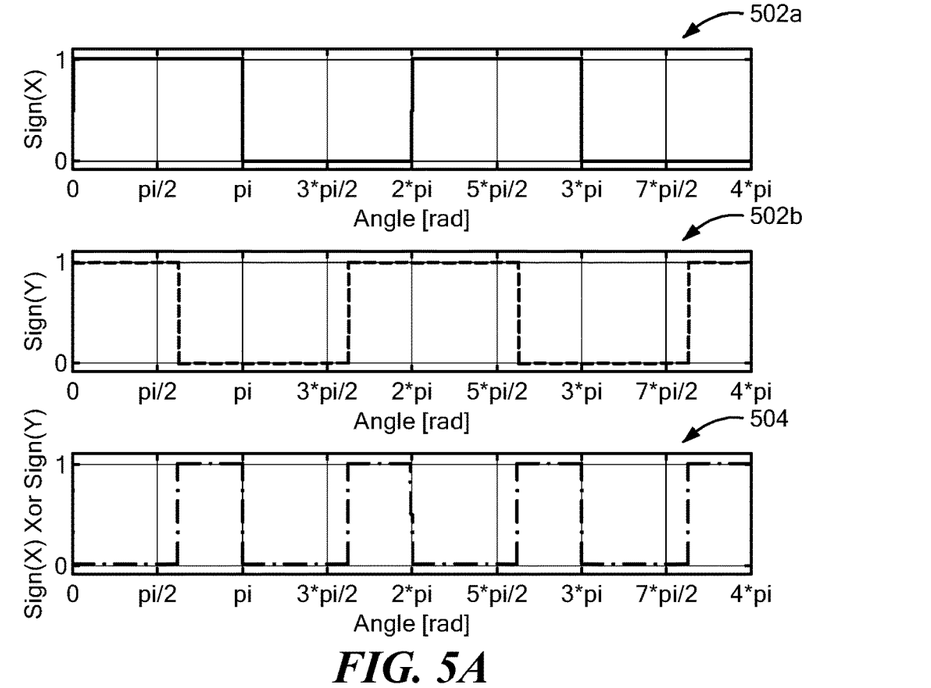
FIGS. 5A and 5B are plots illustrating sign and composite signals that can be generated based on the signals of FIGS. 4A and 4B, respectively.
Figure 5B:
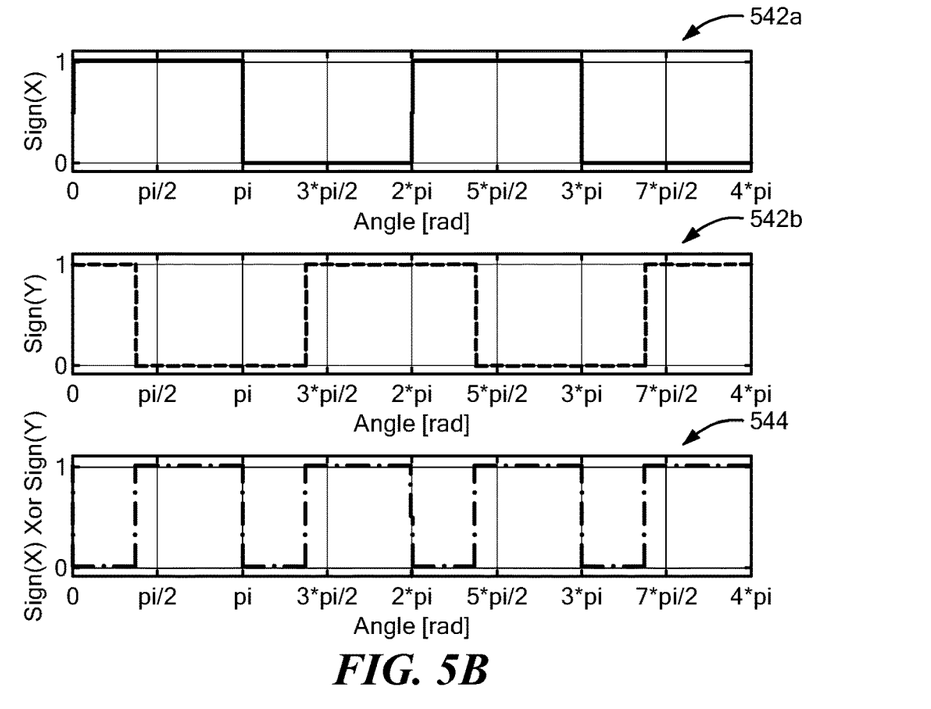

FIGS. 5A and 5B are plots illustrating sign signals and composite signals that can be generated based on the signals shown in FIGS. 4A and 4B, respectively. The sign signals can be generated, for example, using sign blocks 318a, 318b of FIG. 3. The composite signals can be generated using, for example, XOR gate 322 of FIG. 3.

Referring to FIG. 5A, a first sign signal 502a can be generated from first signal 402a of FIG. 4A, a second sign signal 502b can be generated from second signal 402b of FIG. 4A, and a composite signal 504 can be generated from the two sign signals 502a, 502b. As shown, if the non-orthogonality angle $\varphi$ is negative, then the duty cycle of resulting composite signal 504 will be less than 50%.

Referring to FIG. 5B, a first sign signal 542a can be generated from first signal 442a of FIG. 4B, a second sign signal 542b can be generated from second signal 442b of FIG. 4B, and a composite signal 544 can be generated from the two sign signals 542a, 542b. Here it can be seen that if the non-orthogonality angle $\varphi$ is positive, then the duty cycle of the composite signal 544 will be greater than 50%.

Figure 6:
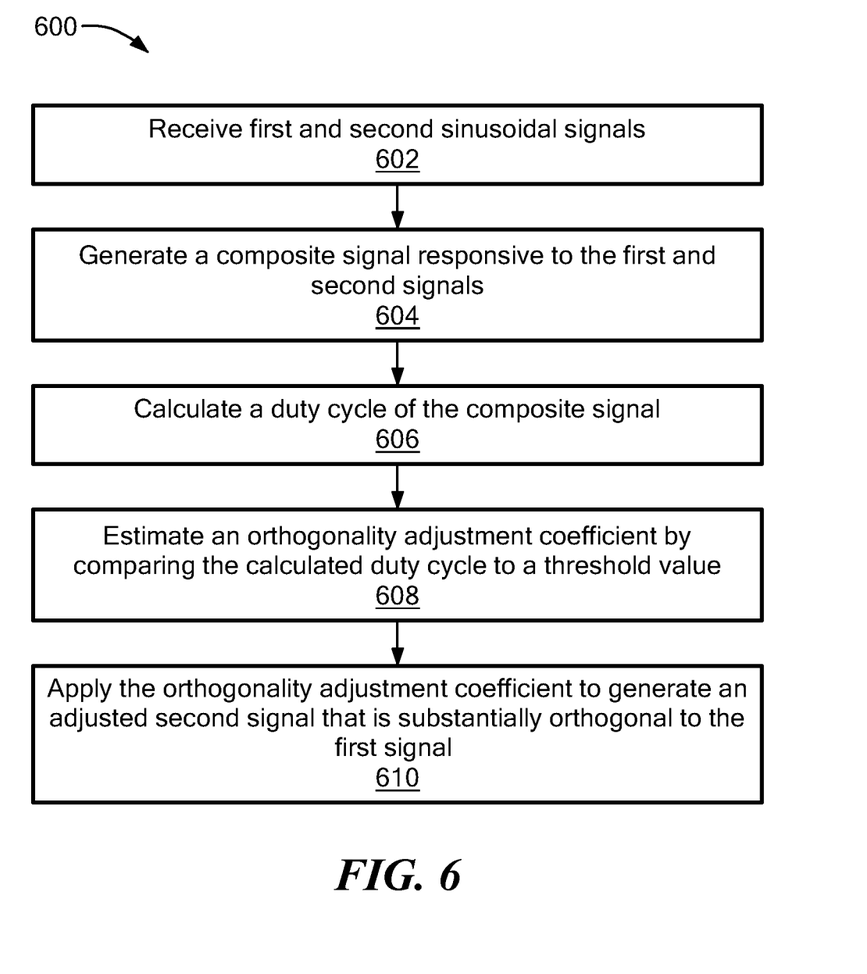
FIG. 6 is a flow diagram showing a process for adjusting non-orthogonality between two signals, according to some embodiments.

FIG. 6 shows a process 600 for adjusting non-orthogonality between two signals, according to some embodiments. The process 600 can be implemented using digital and/or analog circuitry such as the circuitry described above in the context of FIG. 3.

At block 602, first and second sinusoidal signals are received. The signals may have zero offset, substantially equal frequencies and may be, in general, non-orthogonal. In some embodiments, the received signals may be responsive to magnetic fields sensed by magnetic field sensing elements.

At block 604, a composite signal is generated responsive to the first and second signals. In some embodiments, generating the composite signal includes generating a first sign signal indicating a sign of the first signal, generating a second sign signal indicating a sign of the second signal, and generating the composite signal as the exclusive or (XOR) of the first sign signal and the second sign signal. The sign signals can be generated, for example, using sign blocks 318a, 318b of FIG. 3. The composite signal can be generated, for example, using XOR gate 322 of FIG. 3.

At block 606, a duty cycle of the composite signal is calculated and, at block 608, the calculated duty cycle is compared to a threshold value (e.g., 50%) to estimate an orthogonality adjustment coefficient. The duty cycle calculation and comparison can be performed, for example, using duty cycle comparison block 326 of FIG. 3. In some embodiments, estimating the orthogonality adjustment coefficient includes calculating the duty cycle of the composite signal over a single period T (or multiple periods N), comparing the calculated duty cycle to a threshold value to generate a duty cycle comparison value, and accumulating the duty cycle comparison value over time to estimate the orthogonality adjustment coefficient. The processing of blocks 604, 606, and 608 may be performed when the first and second signals have a substantially constant frequency.

At block 610, the orthogonality adjustment coefficient can be applied to generate an adjusted second signal that is substantially orthogonal to the first signal. In some embodiments, applying the adjustment coefficient to generate the adjusted second signal includes scaling the first signal by the adjustment coefficient and subtracting the scaled first signal from the second signal to generate the adjusted second signal, as in equation (8). In some embodiments, the orthogonality adjustment coefficient can be stored in memory where it can be later accessed and used to generate the adjusted second signal.

Figure 7:
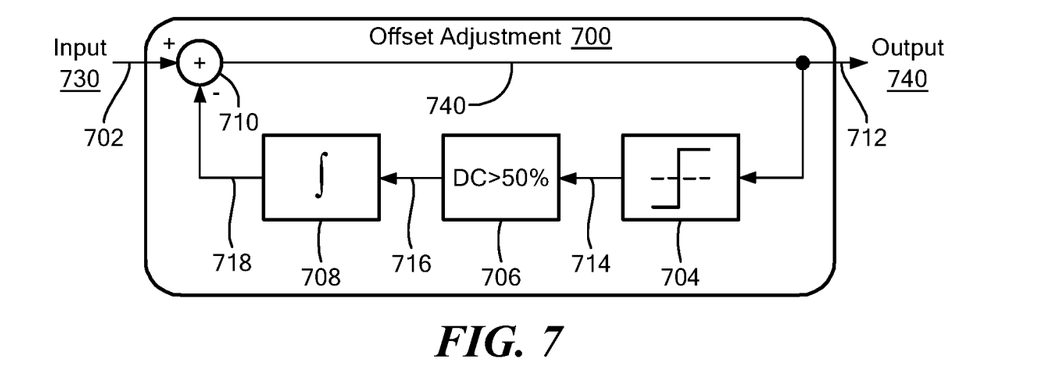
FIG. 7 is a block diagram of an offset adjustment processor, according to some embodiments.

FIG. 7 shows an offset adjustment processor 700 according to some embodiments of the present disclosure. It is appreciated herein that a sinusoidal or other time-varying signal that changes at a constant frequency will have zero offset when the duty cycle of the signal is equal to 50%. The illustrative offset adjustment processor 700 uses a feedback loop to converge on a duty cycle of 50%, thereby eliminating non-zero signal offset. It is appreciated herein that using a duty cycle calculation to perform offset adjustment has the advantage that neither a peak detector nor a zero-crossing detector is required. Moreover, similar circuitry can be used to perform both offset adjustment and non-orthogonality adjustment according to disclosed embodiments.

The illustrative offset adjustment processor 700 includes an input 702 to receive an input signal 730 and an output 712 to provide an output signal 740. In general, input signal 730 has a non-zero offset and output signal 740 has an offset substantially equal to zero. Input signal 730 may be a sinusoidal or other time-varying signal that changes at a substantially constant frequency.

Offset adjustment processor 700 estimates a signal offset 718 of the input signal using a sign block 704, a duty cycle comparison block 706, and an integration block 708, which blocks may be implemented using digital or analog circuitry. Blocks 704, 706, and 708 may be collectively referred to herein as "offset estimation blocks."

Sign block 704 receives the output signal 740 and generates a sign signal 714 indicating a sign thereof. The sign signal 714 may have a square waveform similar in appearance to signals 502a, 502b, 542a, or 542b of FIGS. 5A, 5B. Sign block 704 may be the same as or similar to sign blocks 318a, 318b of FIG. 3.

Duty cycle comparison block 706 receives the sign signal 714 and generates a duty cycle comparison value 716 indicating whether the duty cycle of the signal 740 is greater than or less than some threshold (e.g., 50%). Duty cycle comparison block 706 may be the same as or similar to duty cycle comparison block 326 of FIG. 3. For example, duty cycle comparison block 706 can count the number of clock cycles during which sign signal 714 has a value equal to (1) within a current period of duration T, and compare that count to half the number of clock cycles that occurred within the current period. Here, T refers to the period of sign signal 714. In some embodiments, duty cycle comparison block 706 can count over multiple periods N>1 to reduce/eliminate small limit cycling.

Integration block 708 accumulates the duty cycle comparison value 716 over time to estimate the signal offset 718. Integration block 708 may be the same as or similar to integration block 329 of FIG. 3. The estimated offset 718 is subtracted from the input signal 730 using summation block 710, as shown.

As shown in FIG. 7, offset estimation blocks 704, 706, 708 can be arranged in a closed loop with the summation block 710. In this arrangement, offset estimation blocks 704, 706, 708 continually estimate the signal offset 718 based on input signal 730. This approach may be suitable where input signal 730 has a substantially constant frequency during operation of the device/system in which offset adjustment processor 700 is employed. In other embodiments (e.g., where input signal 730 has a variable frequency), offset estimation blocks 704, 706, 708 can be used to estimate the signal offset 718 in a non-continuous manner and the estimated offset 718 can be stored in memory (not shown) where it can be later accessed and used to adjust the signal offset.

Figure 8:
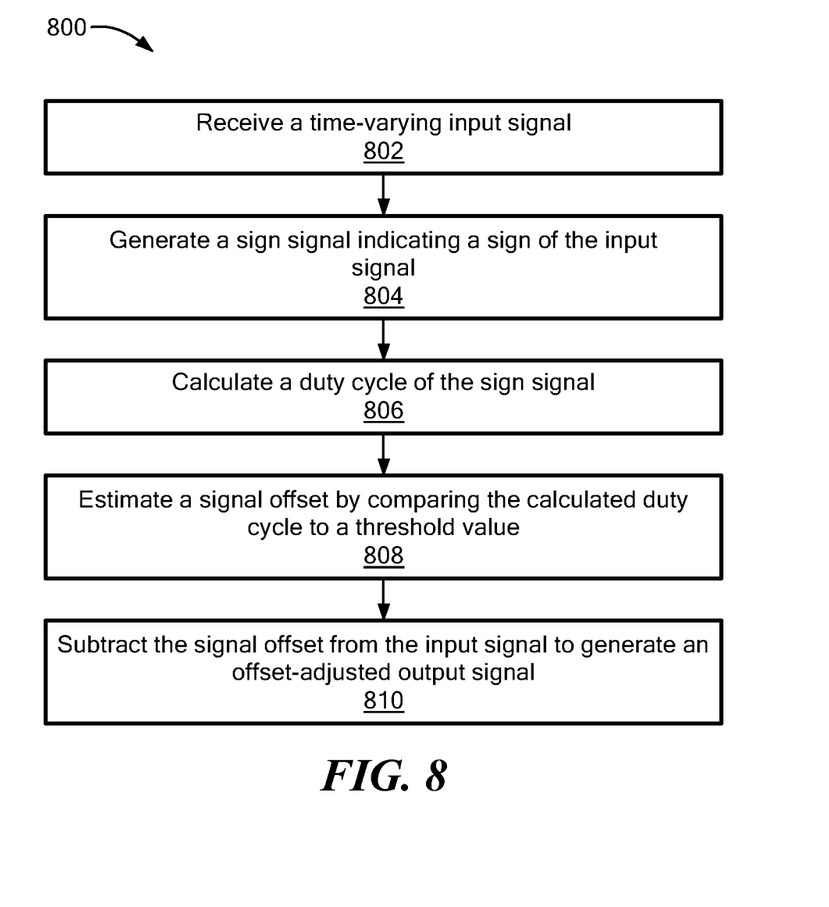
FIG. 8 is a flow diagram showing a process for adjusting a signal offset, according to some embodiments.

FIG. 8 shows a process 800 for adjusting a signal offset, according to some embodiments. The illustrative process 800 can be implemented using digital and/or analog circuitry such as the circuitry described above in the context of FIG. 7.

At block 802, a sinusoidal or other time-varying input signal is received. The input signal may have a substantially constant frequency. At block 804, a sign signal is generated that indicates a sign of the input signal. The sign signal can be generated, for example, using sign block 704 of FIG. 7.

At block 806, a duty cycle of the sign signal is calculated and, at block 808, the calculated duty cycle is compared to a threshold value (e.g., 50%) to estimate a signal offset. The duty cycle calculation and comparison can be performed, for example, using duty cycle comparison block 706 of FIG. 7. In some embodiments, estimating the signal offset includes calculating the duty cycle of the sign signal over a period of duration T (or multiple periods N), comparing the calculated duty cycle to a threshold value to generate a duty cycle comparison value, and accumulating the duty cycle comparison value over time to estimate the signal offset. The processing of blocks 804, 806, and 808 may be performed when the input signal has a substantially constant frequency.

At block 810, the estimated signal offset is subtracted from the input signal to generate an output signal having substantially zero offset. In some embodiments, the estimated signal offset can be stored in memory where it can be later accessed and used for offset adjustment.

The subject matter described herein can be implemented in digital or analog electronic circuitry, or in computer software, firmware, or hardware, including the structural means disclosed in this specification and structural equivalents thereof, or in combinations of them. The subject matter described herein can be implemented as one or more computer program products, such as one or more computer programs tangibly embodied in an information carrier (e.g., in a machine-readable storage device), or embodied in a propagated signal, for execution by, or to control the operation of, data processing apparatus (e.g., a programmable processor, a computer, or multiple computers). A computer program (also known as a program, software, software application, or code) can be written in any form of programming language, including compiled or interpreted languages, and it can be deployed in any form, including as a stand-alone program or as a module, component, subroutine, or another unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub programs, or portions of code). A computer program can be deployed to be executed on one computer or on multiple computers at one site or distributed across multiple sites and interconnected by a communication network.

The processes and logic flows described in this specification, including the method steps of the subject matter described herein, can be performed by one or more programmable processors executing one or more computer programs to perform functions of the subject matter described herein by operating on input data and generating output. The processes and logic flows can also be performed by, and apparatus of the subject matter described herein can be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processor of any kind of digital computer. Generally, a processor will receive instructions and data from a read-only memory or a random-access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. Information carriers suitable for embodying computer program instructions and data include all forms of nonvolatile memory, including by ways of example semiconductor memory devices, such as EPROM, EEPROM, flash memory device, or magnetic disks. The processor and the memory can be supplemented by, or incorporated in, special purpose logic circuitry.

In the foregoing detailed description, various features are grouped together in one or more individual embodiments for the purpose of streamlining the disclosure. This method of disclosure is not to be interpreted as reflecting an intention that each claim requires more features than are expressly recited therein. Rather, inventive aspects may lie in less than all features of each disclosed embodiment.

The disclosed subject matter is not limited in its application to the details of construction and to the arrangements of the components set forth in the following description or illustrated in the drawings. The disclosed subject matter is capable of other embodiments and of being practiced and carried out in various ways. As such, those skilled in the art will appreciate that the conception, upon which this disclosure is based, may readily be utilized as a basis for the designing of other structures, methods, and systems for carrying out the several purposes of the disclosed subject matter. Therefore, the claims should be regarded as including such equivalent constructions insofar as they do not depart from the spirit and scope of the disclosed subject matter.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter.

All publications and references cited herein are expressly incorporated herein by reference in their entirety.

The invention claimed is:

1. A method implemented in electronic circuitry, the method comprising:
   receiving a first signal having a sinusoidal waveform;
   receiving a second signal having a sinusoidal waveform;
   generating a composite signal responsive to the first and second signals;
   determining an orthogonality adjustment coefficient based on a duty cycle of the composite signal; and
   applying the orthogonality adjustment coefficient to generate an adjusted second signal that is orthogonal to the first signal.

2. The method of claim 1, comprising:
   calculating the duty cycle of the composite signal; and
   determining the orthogonality adjustment coefficient by comparing the duty cycle to a threshold value.

3. The method of claim 2, wherein the threshold value is 50%.

4. The method of claim 1, wherein generating the composite signal responsive to the first and second signals comprises:
   generating a first sign signal indicating a sign of the first signal;
   generating a second sign signal indicating a sign of the second signal; and
   generating the composite signal as an exclusive or (XOR) of the first sign signal and the second sign signal.

5. The method of claim 1, wherein determining the orthogonality adjustment coefficient comprises:
   calculating the duty cycle of the composite signal for a current signal period;
   comparing the calculated duty cycle to a threshold value to generate a duty cycle comparison value; and
   accumulating the duty cycle comparison value over time to generate the orthogonality adjustment coefficient.

6. The method of claim 1, wherein applying the orthogonality adjustment coefficient to generate the adjusted second signal comprises:
   scaling the first signal by the orthogonality adjustment coefficient; and
   subtracting the scaled first signal from the second signal to generate the adjusted second signal.

7. The method of claim 1, wherein the first signal and the second signal are responsive to a magnetic field.

8. The method of claim 1, wherein the first signal and the second signal have zero offset.

9. The method of claim 1, wherein the first signal and the second signal have the same frequency.

10. The method of claim 1, comprising:
    storing the orthogonality adjustment coefficient to a memory,
    wherein applying the orthogonality adjustment coefficient to generate the adjusted second signal includes accessing the orthogonality adjustment coefficient from the memory.

11. A system including an orthogonality adjustment processor that comprises:
    a first input to receive a first signal having a sinusoidal waveform;
    a second input to receive a second signal having a sinusoidal waveform;
    a coefficient estimation circuit configured to:
       generate a composite signal responsive to the first and second signals, and
       determine an orthogonality adjustment coefficient based on a duty cycle of the composite signal;
    a compensation circuit configured to apply the orthogonality adjustment coefficient to generate an adjusted second signal;
    a first output to provide the first signal; and
    a second output to provide the adjusted second signal.

12. The system of claim 11, wherein the coefficient estimation circuit is configured to:
    calculate the duty cycle of the composite signal; and
    determine the orthogonality adjustment coefficient by comparing the duty cycle to a threshold value.

13. The system of claim 12, wherein the threshold value is 50%.

14. The system of claim 11, wherein the coefficient estimation circuit is configured to:
    generate a first sign signal indicating a sign of the first signal;
    generate a second sign signal indicating a sign of the second signal; and
    generating the composite signal as an exclusive or (XOR) of the first sign signal and the second sign signal.

15. The system of claim 11, wherein the coefficient estimation circuit is configured to:
    calculate the duty cycle of the composite signal for a current signal period;
    compare the calculated duty cycle to a threshold value to generate a duty cycle comparison value; and
    accumulate the duty cycle comparison value over time to generate the orthogonality adjustment coefficient.

16. The system of claim 11, wherein the compensation circuit is configured to:
    scale the first signal by the orthogonality adjustment coefficient; and
    subtract the scaled first signal from the second signal to generate the adjusted second signal.

17. The system of claim 11, comprising a first magnetic field sensing element and a second magnetic field sensing element, wherein the first signal and the second signal are responsive to a magnetic field sensed by the first and second magnetic field sensing elements respectively.

18. The system of claim 11, wherein the first signal and the second signal have zero offset.

19. The system of claim 11, wherein the first signal and the second signal have the same frequency.

20. The system of claim 11, further comprising a memory configured to store the orthogonality adjustment coefficient, wherein the compensation circuit is configured to access the orthogonality adjustment coefficient from the memory.

21. A method implemented in electronic circuitry, the method comprising:
   receiving a time-varying input signal;
   generating a sign signal indicating a sign of the input signal;
   calculating a duty cycle of the sign signal;
   estimating a signal offset value by comparing the calculated duty cycle to a threshold value; and
   subtracting the signal offset value from the input signal to generate an output signal having zero offset.

* * * * *

UNITED STATES PATENT AND TRADEMARK OFFICE
CERTIFICATE OF CORRECTION

PATENT NO. : 11,480,630 B2  
APPLICATION NO. : 17/112107  
DATED : October 25, 2022  
INVENTOR(S) : Sergio Nicolás Deligiannis et al.

Page 1 of 1

It is certified that error appears in the above-identified patent and that said Letters Patent is hereby corrected as shown below:

In the Specification

Column 6, Line 12 delete "202$x$" and replace with --200$x$--.

Column 6, Line 14 delete "202$y$" and replace with --200$y$--.

Column 6, Line 28 delete "222$x$ and a vertical axis 222$y$" and replace with --220$x$ and a vertical axis 220$y$--.

Column 6, Line 29 delete "202$x$ and 202$y$" and replace with --200$x$ and 200$y$--.

Column 8, Lines 58-59 delete "block 328" and replace with --block 329--.

Signed and Sealed this  
Fourteenth Day of November, 2023

Katherine Kelly Vidal  
*Director of the United States Patent and Trademark Office*